(12) United States Patent
Golesh

(10) Patent No.: US 12,343,591 B2
(45) Date of Patent: Jul. 1, 2025

(54) EXERCISE BICYCLE BRAKE ASSEMBLY FOR PROVIDING VARIABLE BRAKING SIGNALS

(71) Applicant: SPIA Cycling Inc., Boulder, CO (US)

(72) Inventor: Eric Golesh, Arvada, CO (US)

(73) Assignee: SPIA Cycling Inc., Boulder, CO (US)

( * ) Notice: Subject to any disclaimer, the term of this patent is extended or adjusted under 35 U.S.C. 154(b) by 145 days.

(21) Appl. No.: 17/008,325

(22) Filed: Aug. 31, 2020

(65) Prior Publication Data

US 2021/0060372 A1 Mar. 4, 2021

Related U.S. Application Data

(60) Provisional application No. 62/894,604, filed on Aug. 30, 2019.

(51) Int. Cl.
| | |
|---|---|
| *G05G 1/04* | (2006.01) |
| *A63B 21/005* | (2006.01) |
| *A63B 21/015* | (2006.01) |
| *A63B 22/06* | (2006.01) |
| *A63B 24/00* | (2006.01) |

(Continued)

(52) U.S. Cl.
CPC ........ *A63B 22/0605* (2013.01); *A63B 21/005* (2013.01); *A63B 21/015* (2013.01); *A63B 24/0062* (2013.01); *G05G 1/015* (2013.01); *G05G 1/04* (2013.01); *G05G 5/05* (2013.01); *G05G 5/12* (2013.01); *H05K 7/1417* (2013.01); *A63B 2024/0093* (2013.01);

(Continued)

(58) Field of Classification Search
None
See application file for complete search history.

(56) References Cited

U.S. PATENT DOCUMENTS 6,712,737 B1 * 3/2004 Nusbaum ............... A63B 69/16
482/8
6,905,445 B1 * 6/2005 Lin ...................... A63B 21/4049
188/24.11

(Continued)

FOREIGN PATENT DOCUMENTS

DE 102009039620 A1 * 3/2011 .............. B60T 11/16
DE 202014100854 U1 * 7/2014 .............. B60T 11/16

(Continued)

*Primary Examiner* — Shila Jalalzadeh Abyaneh
(74) *Attorney, Agent, or Firm* — Polsinelli PC; Gregory P. Durbin

(57) ABSTRACT

A brake lever assembly includes a hood body and a brake lever movably coupled to the hood body. The hood body defines an internal cavity containing a transducer coupled to the brake lever such that an output of the transducer corresponds to a position of the brake lever. The transducer output may then be used to control a resistance element of an exercise device (e.g., a stationary bicycle) to simulate application of braking force by a rider. The transducer may be a linear potentiometer disposed within the cavity and coupled to a plunger assembly. The plunger assembly may include a plunger coupled to each of the linear potentiometer and the brake lever such that movement of the brake lever moves the linear potentiometer and varies the output of the potentiometer. The brake lever assembly may include additional buttons for upshifting, downshifting, and/or other controls.

7 Claims, 14 Drawing Sheets

(51) Int. Cl.
  *G05G 1/015* (2008.04)
  *G05G 5/05* (2006.01)
  *G05G 5/12* (2006.01)
  *H05K 7/14* (2006.01)

(52) U.S. Cl.
  CPC ..... *A63B 2220/13* (2013.01); *A63B 2220/833* (2013.01); *G05G 2505/00* (2013.01); *G05G 2700/16* (2013.01)

(56) References Cited

U.S. PATENT DOCUMENTS

| | | | | |
|---|---|---|---|---|
| 8,052,581 | B1* | 11/2011 | Lohr | A63B 21/015 |
| | | | | 482/63 |
| 9,475,542 | B2* | 10/2016 | Marioni | B62L 3/02 |
| 10,799,755 | B2* | 10/2020 | Cristofori | A63B 23/0476 |
| 2003/0051571 | A1* | 3/2003 | Staker | B60K 26/021 |
| | | | | 74/514 |
| 2006/0234840 | A1* | 10/2006 | Watson | A63B 22/0605 |
| | | | | 482/61 |
| 2007/0013655 | A1* | 1/2007 | Rosenberg | A63B 21/0057 |
| | | | | 345/156 |
| 2011/0048832 | A1* | 3/2011 | Wismann | B62K 11/04 |
| | | | | 180/315 |
| 2013/0090196 | A1* | 4/2013 | Yamaguchi | B62M 9/122 |
| | | | | 474/80 |
| 2013/0228405 | A1* | 9/2013 | Tsai | B62J 45/422 |
| | | | | 188/344 |
| 2014/0165763 | A1* | 6/2014 | Harris | B62K 23/06 |
| | | | | 74/473.12 |
| 2016/0055994 | A1* | 2/2016 | Hujer | B62L 3/023 |
| | | | | 200/50.01 |
| 2016/0129968 | A1* | 5/2016 | Meggiolan | B62L 3/023 |
| | | | | 188/344 |
| 2019/0106176 | A1* | 4/2019 | Luo | B62K 23/06 |
| 2019/0300104 | A1* | 10/2019 | Saruwatari | B62K 23/06 |
| 2020/0331440 | A1* | 10/2020 | Stubberud | B60T 7/16 |

FOREIGN PATENT DOCUMENTS

| | | | | |
|---|---|---|---|---|
| KR | 20120031415 A | * | 4/2012 | ............ B62K 23/06 |
| KR | 20150095257 A | * | 8/2015 | ............... G05G 1/04 |

* cited by examiner

EXERCISE BICYCLE BRAKE ASSEMBLY FOR PROVIDING VARIABLE BRAKING SIGNALS

CROSS-REFERENCE TO RELATED APPLICATION

The present patent application claims priority under 35 U.S.C. § 119 to provisional patent application No. 62/894,604 titled "Exercise Bicycle Brake Assembly for Providing Variable Braking Signals" filed on Aug. 30, 2019, which is hereby incorporated by reference herein.

TECHNICAL FIELD

The present disclosure relates to an exercise bicycle brake assembly controller, and in particular, a brake assembly capable of providing electronic control signals.

BACKGROUND

Conventional bicycle brake levers include a brake lever that actuates a brake, either hydraulically or through a cable. Exercise bicycles typically also use some form of mechanical resistance or brake assembly. In some cases, electronic shifting functions can be integrated with the brake lever. Stationary bicycles and bicycle training devices may also incorporate electronic control systems that dynamically control resistance and braking. Such electronic control systems may change resistance based on input from a rider or training software executed on a computing device. Notably, such systems lack a way of accurately simulating braking forces applied by a rider.

It is with these observations in mind, among others, that various aspects of the present disclosure were conceived and developed.

SUMMARY

One implementation of the present disclosure provides for a brake lever assembly. For example, a brake assembly according to an embodiment hereof, may include a hood body coupleable to a handlebar and defining an internal hood cavity. A brake lever may be movably coupled to the hood body and a transducer may be disposed within the internal hood cavity, with the transducer generating a variable output in response to movement of the brake lever, and with the output corresponding to a current position of the brake lever.

Another implementation of the present disclosure, as shown in FIG. 14, provides for an exercise device 10 including a brake lever assembly 100 according to the present disclosure. For example, an exercise device, according to an embodiment hereof, may include a frame 12 supporting a handlebar 14 and a rotatable element 16 with a pair of pedals 20 coupled to the frame to drive the rotatable element. The exercise device may further include a brake assembly coupled to the handlebar. The brake assembly comprises, in one example, a hood body coupled to the handlebar and defining an internal hood cavity, a brake lever movably coupled to the hood body and a transducer disposed within the internal hood cavity. The transducer generates a transducer output in response to movement of the brake lever, the transducer output corresponding to a current position of the brake lever. The exercise device may further include a variable resistance device 18 supported by the frame to control a resistance of the rotatable element to being driven, the control of the resistance corresponding to the transducer output.

Yet another implementation of the present disclosure provides for a method of controlling resistance of an exercise device using a brake lever according to the present disclosure. In one example, a method involves measuring an output of a transducer disposed within an internal cavity of a hood body, each of the hood body and the transducer coupled to a brake lever such that the output of the transducer corresponds to a position of the brake lever. The method further involves transmitting the output to a computing device of an exercise device, the exercise device further including a resistance element electronically controllable by the computing device. In response to receiving the output, the method involves changing a resistance setting of the resistance element, the resistance setting corresponding to the position of the brake lever.

These and other aspects are disclosed in further detail in the description set out below.

DETAILED DESCRIPTION

Figure 1:
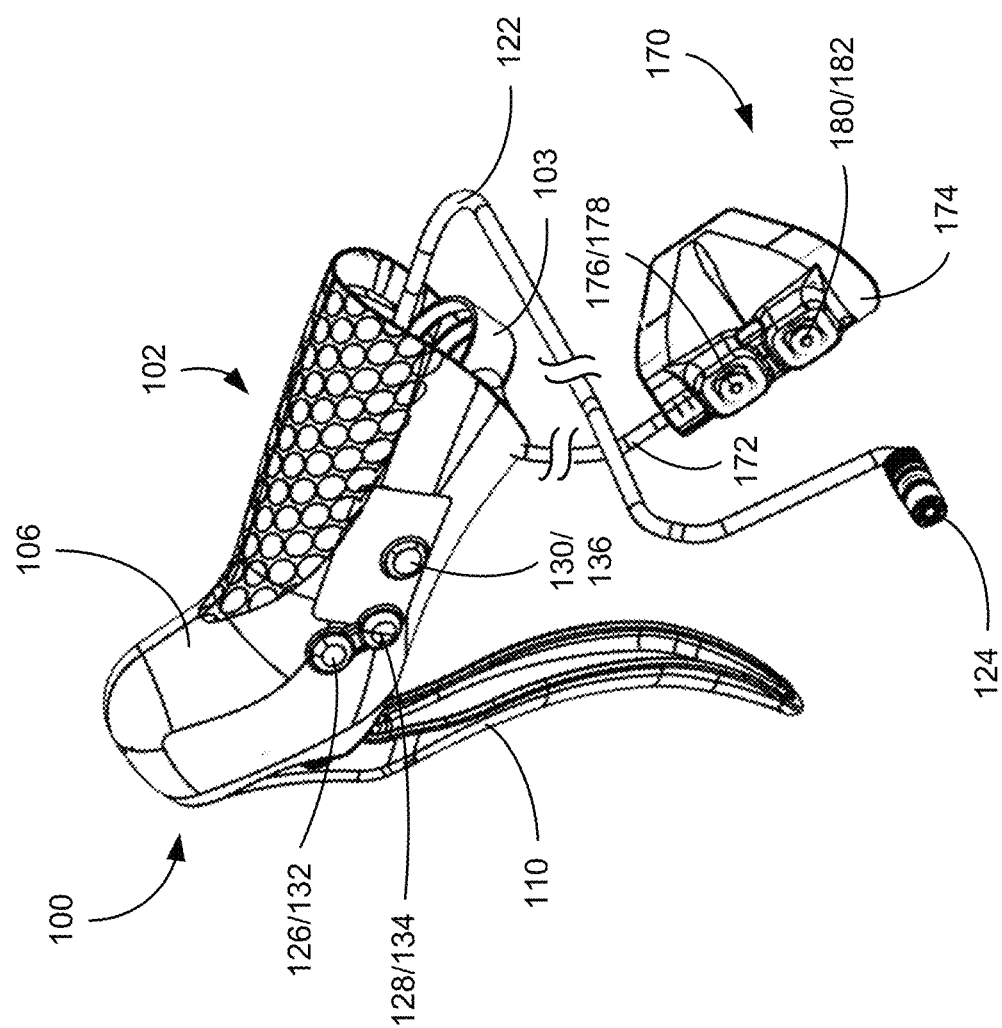
FIG. 1 is a perspective view of a brake assembly in accordance with an implementation of the present disclosure.

The present disclosure is directed to a brake assembly configured to provide a variable braking signal for use in controlling one or more devices communicatively coupled to the brake assembly. The controllable braking signals provided by the brake assembly may be used, for example, to control resistance/braking of an electronically controlled resistance (e.g., an electromagnetic brake) or other aspects of a training device (e.g., an electronic stationary bicycle) and/or as input to training software running on a computing device in communication with the electronic stationary bicycle or input to a resistance assembly. In at least some implementations, the brake assembly may include additional input devices (e.g., buttons) to provide inputs or initiate other functions of the training device. For example, the brake assembly may include shifting buttons (depressing of which may send a signal to control the brake, a brake/motor, and/or a motor where simulation of a gear shift is provided) and/or a general control button for making confirmations or selections in training software.

In implementations of the present disclosure, variable braking signals are provided by an electronics assembly disposed within a hood body of the brake assembly. More specifically, the hood body defines a cavity within which each of a plunger assembly and an electronics assembly are disposed. The plunger assembly includes a movable plunger coupled to a brake lever such that as a rider presses or releases the brake lever, the plunger translates within the housing. The plunger is coupled to a transducer of the electronics assembly such that, as the plunger translates within the housing, the transducer provides a variable signal corresponding to the position of the plunger and that further corresponds to the position of the brake lever. Accordingly, based on the output of the transducer, a computing device in communication with the brake assembly may determine a position of the brake lever and a corresponding braking or resistance setting. In a conventional brake housing, connection to a cable or hydraulic actuation is provided to actuate conventional bicycle brakes, unlike the present disclosure. While the examples herein do not illustrate use in a conventional bicycle, it is possible to provide the variable signal to an electronic brake for a conventional bicycle, by wire or wirelessly, for actuation thereof.

In one specific implementation, the transducer is a linear potentiometer having a slider coupled to a guide extending from the plunger. As the plunger translates within the housing of the plunger assembly, the slider of the potentiometer also translates, varying the resistance and output voltage of the potentiometer. The output voltage of the potentiometer therefore provides an indication of the position of the brake lever and the associated brake force being applied. An output voltage signal corresponding to the measured output voltage may then be provided by the brake and shifter assembly to a connected device to control resistance/braking of the device, etc., as noted above.

Figure 2:
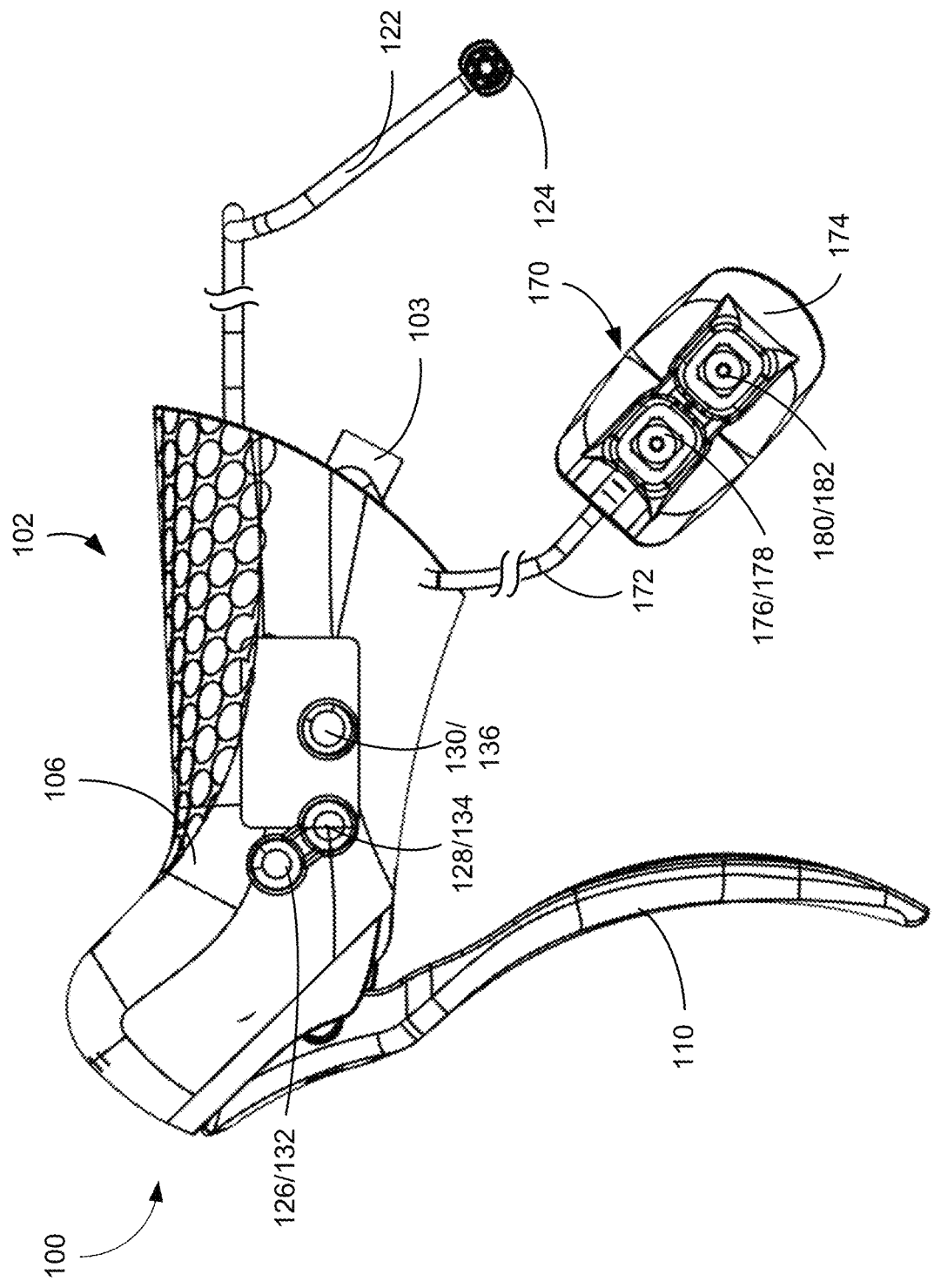
FIG. 2 is a side view of the brake assembly of FIG. 1.

Referring now to the figures, a perspective view and a side elevation view of an implementation of a brake assembly 100 according to the present disclosure are provided in FIGS. 1 and 2, respectively. Further reference is made to FIG. 3, which is a detailed perspective view of a portion of the brake assembly 100 with a hood cover 106 (shown in FIGS. 1 and 2) removed to illustrate certain internal aspects of the brake assembly 100. The brake assembly 100 is illustrated in a right-hand configuration; however, it should be appreciated that the brake assembly 100 may be readily adapted for a left hand-configuration. Moreover, in certain implementations a given stationary bicycle or training system may include each of a right-handed brake assembly and a left-handed brake assembly. In such cases, some or all of the control functionality discussed below may be implemented in one or both of the brake assemblies.

The brake assembly 100 is coupleable to a handlebar 14, e.g., a handlebar of a stationary or conventional bicycle, by a clamp 103 (or similar coupling) and generally includes a hood assembly 102 from which a brake lever 110 extends. During operation, the brake lever 110 may be depressed and released by a user to generate variable braking signals corresponding to the position of the brake lever 110. Such braking signals may then be transmitted to a computing device (not shown) communicatively coupled to the brake assembly 100. For example, the brake assembly 100 may include a connector cable 124 terminating in a connector 122 adapted to communicatively couple the brake assembly 100 to a computing device (not shown) of a stationary bike 10 or trainer. The connector 122 and connector cable 124 may also be configured to provide signals and power from the computing device to the various electronic components of the brake assembly 100. Regarding power, the brake assembly 100 may also include a battery or similar power source instead of or in addition to receiving power from an external source.

Figure 3:
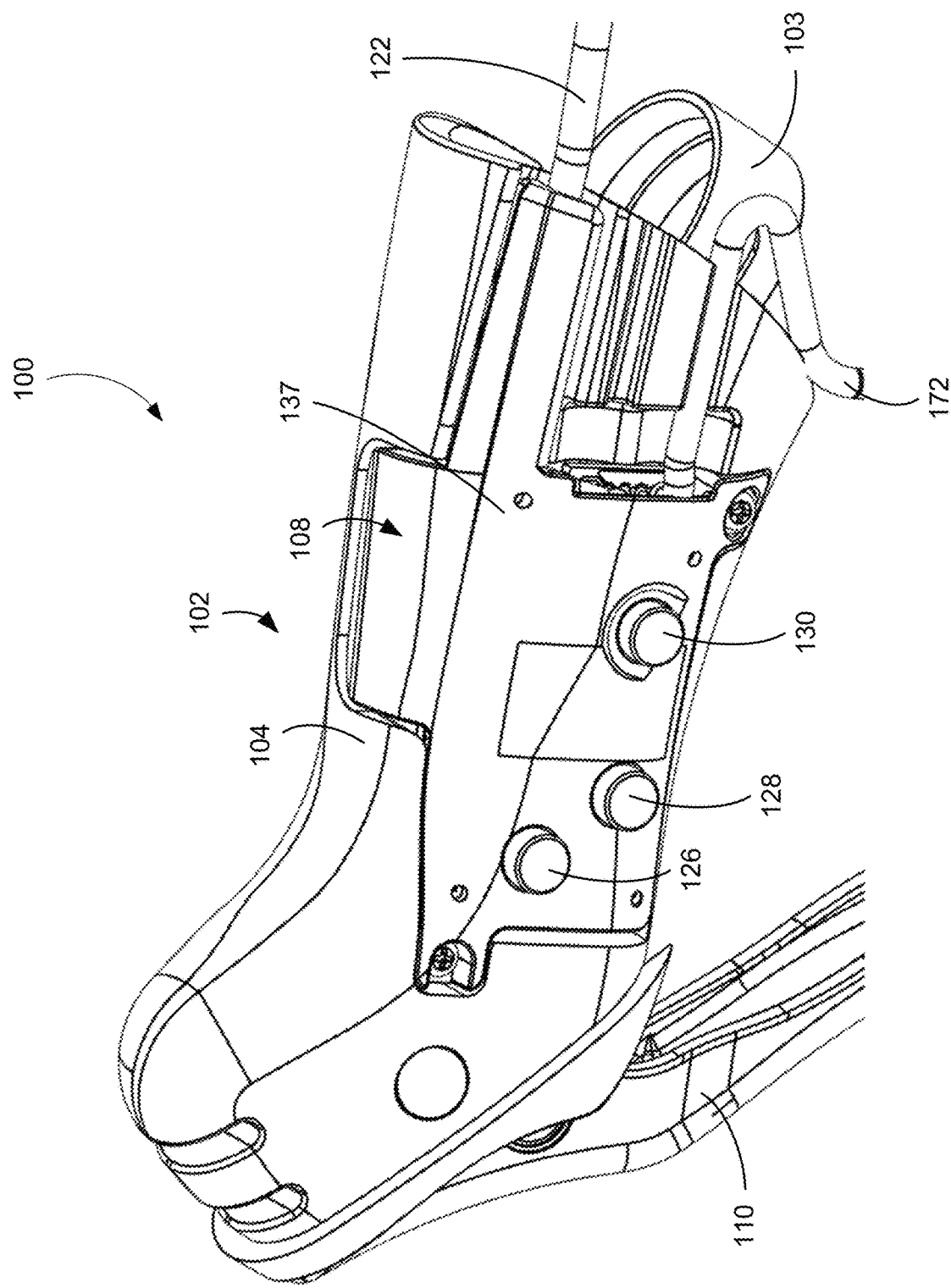
FIG. 3 is a detailed perspective view of the brake assembly of FIG. 1 with a hood cover removed.

The hood assembly 102 generally includes a hood body 104 that defines a hood cavity 108 (each shown in FIG. 3). As described below in further detail, the hood cavity 108 generally contains the various mechanical and electronic components for translating movement of the brake lever 110 into corresponding electrical signals. As illustrated in FIGS. 1 and 2, the hood body 104 may be covered by a hood cover 106 to protect the internal components of the hood assembly 102, to provide a comfortable surface for a user to grip, and the like.

In addition to providing braking signals corresponding to movement of the brake lever 110, the brake assembly 100 may include other components for receiving input from a user. In the implementation illustrated in FIGS. 1-3, for example, the hood assembly 102 includes three buttons. More specifically, as shown in FIG. 3, the hood assembly 102 includes an upshift button 126, a downshift button 128, and a control button 130 (collectively referred to herein as the "hood buttons") extending from an inside surface of the hood body 106. As illustrated in FIGS. 1 and 2, each of the upshift button 126, the downshift button 128, and the control button 130 may be covered by a respective button cover (i.e., upshift button cover 132, downshift button cover 134, and control button cover 136), which may be integrated into the hood cover 106 and which may generally protect the buttons and underlying electronics. Further protection of the buttons and internal components of the hood assembly 102 may be provided by a rigid button plate 137 (shown in FIG. 3) covering the hood cavity 108 and through which the buttons extend.

During operation, a user may actuate the various buttons to provide additional signals to a computing device, e.g., of a stationary bike, of a trainer, and/or otherwise executing training software. For example, in response to the user pressing the upshift button 126, a signal may be transmitted from the brake assembly 100 that causes the computing device to perform a stepwise increase in resistance, e.g., by increasing resistance provided by an electric motor or actuating an electronic derailleur to change gears. Similarly, pressing the downshift button 128 may result in a signal being transmitted from the brake assembly 100 that causes the computing device to perform a stepwise decrease in resistance. To the extent the training device includes physical gears, actuation of the upshift button 126 and the downshift button 128 may also cause the training device to mechanically shift between gears. If a motor is employed, upshift and downshifts may also result in acceleration or deceleration from the motor, which may be synchronized with other virtual inputs like slope and wind, as well as measurements of power or cadence, among others.

The control button 130 is provided as a general purpose button to which any of a variety of functions may be assigned. For example and without limitation, the control button may be used to make or confirm selections provided by training software, to control an avatar (e.g., steering, entering/exiting a peloton, etc.) of an interactive game, to control ancillary functions of a computing device (e.g., start/stop a music player, answer a phone call, etc.), to change resistance in a manner other than provided by the upshift/downshift buttons (e.g., to toggle large shifts in resistance for interval-based training). In certain implementations, some or all of the buttons of the brake assembly 100 may be customizable by a user. Moreover, each of the buttons may be used to provide various signals. For example, a given button may provide a first signal in response to the button being pressed and immediately released and a second signal in response to the button being held for a predetermined time. Similarly, a given button may provide a first signal in response to a first input pattern (e.g., single-click) and a second signal in response to a second input pattern (e.g., double-click).

Figure 11:
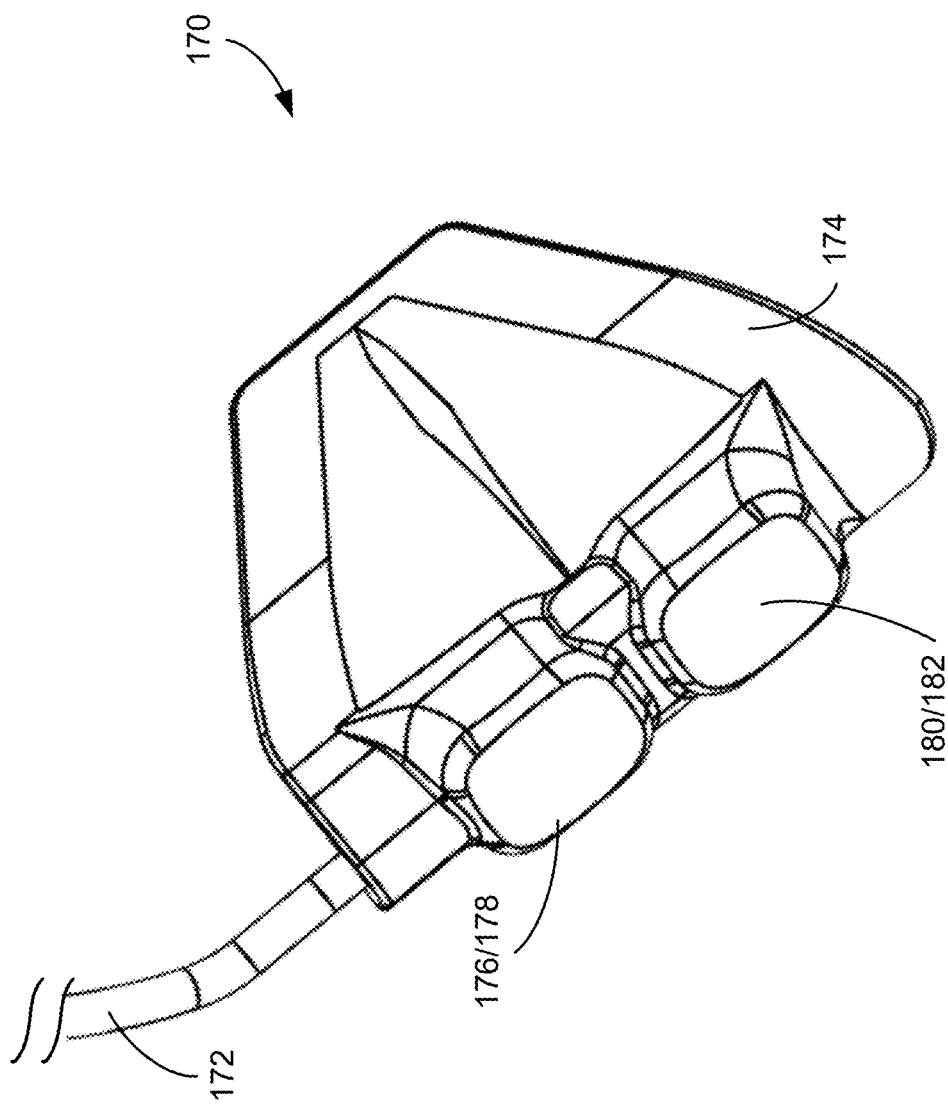
FIG. 11 is a first perspective view of a remote control assembly of the brake assembly of FIG. 1.
Figure 12:
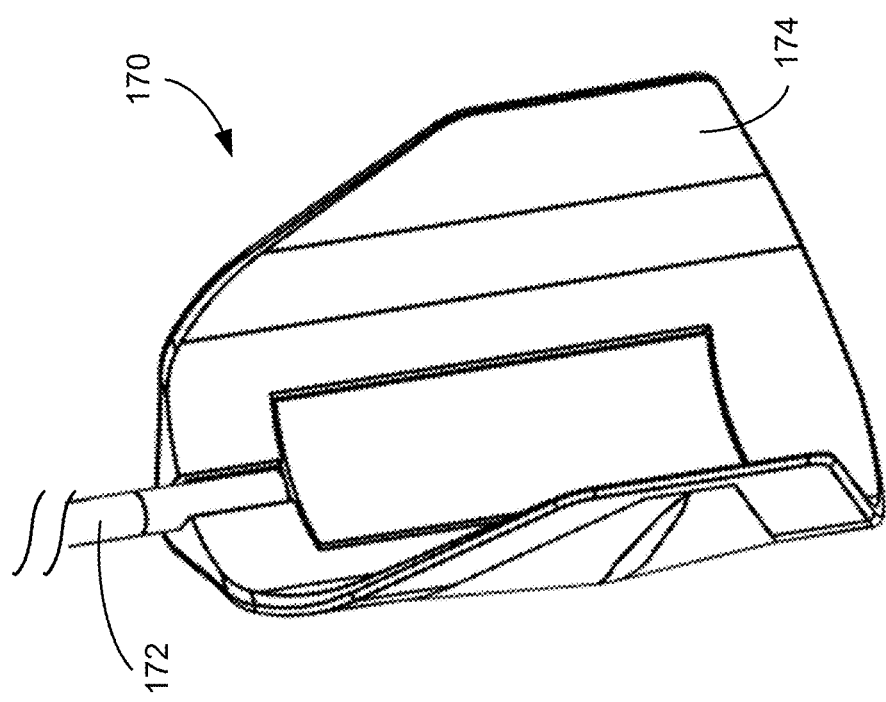
FIG. 12 is a second perspective view of the remote control assembly.
Figure 13:
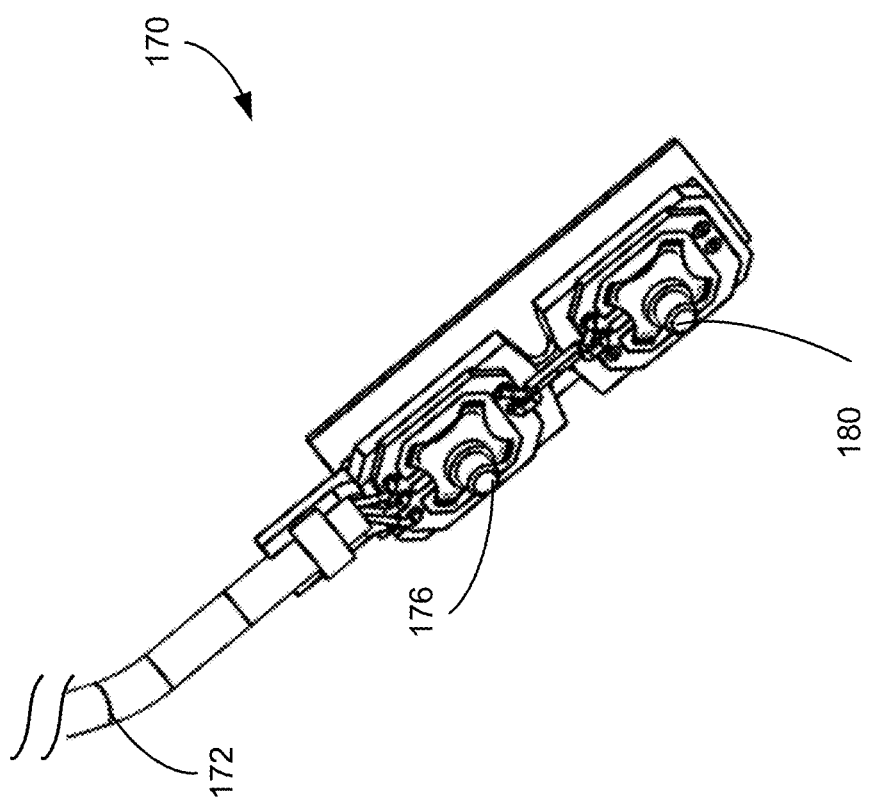
FIG. 13 is a third perspective view of the remote control assembly with a cover removed.
Figure 14:
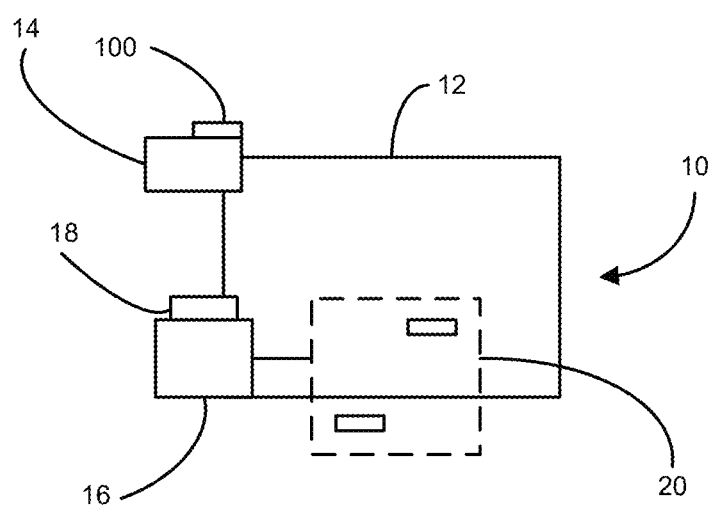
FIG. 14 is a perspective view of an exercise device including the brake assembly.

As illustrated in FIGS. 1 and 2, the brake assembly 100 may also include a remote control assembly 170 coupled to the hood assembly 102 by a cable 172 instead of or in addition to the controls integrated into the hood assembly 102. The remote control assembly 170 is also illustrated in further detail in FIGS. 11-13, which illustrate the remote control assembly 170 in each of a front perspective view, a rear perspective view, and a front perspective view with a cover 174 removed. In general, the remote control assembly 170 may be mounted on other locations of the handlebars or bicycle frame to facilitate control access, e.g., when the user is in alternative riding positions. For example, the remote control assembly 170 includes each of an upshift button 176 and a remote control downshift button 180 (collectively referred to as the "remote control buttons" for purposes of this disclosure) and is adapted to be coupled to drops of a drop bar such that a user may readily vary resistance/shift gears when riding in a dropped position. Similar to the hood assembly 102, the remote control assembly 170 may include a remote control assembly cover 174 having each of an upshift button cover 178 and a downshift button cover 182 integrally formed into the cover 174 and that extend over the upshift button 176 and the downshift button 180, respectively.

Figure 4:
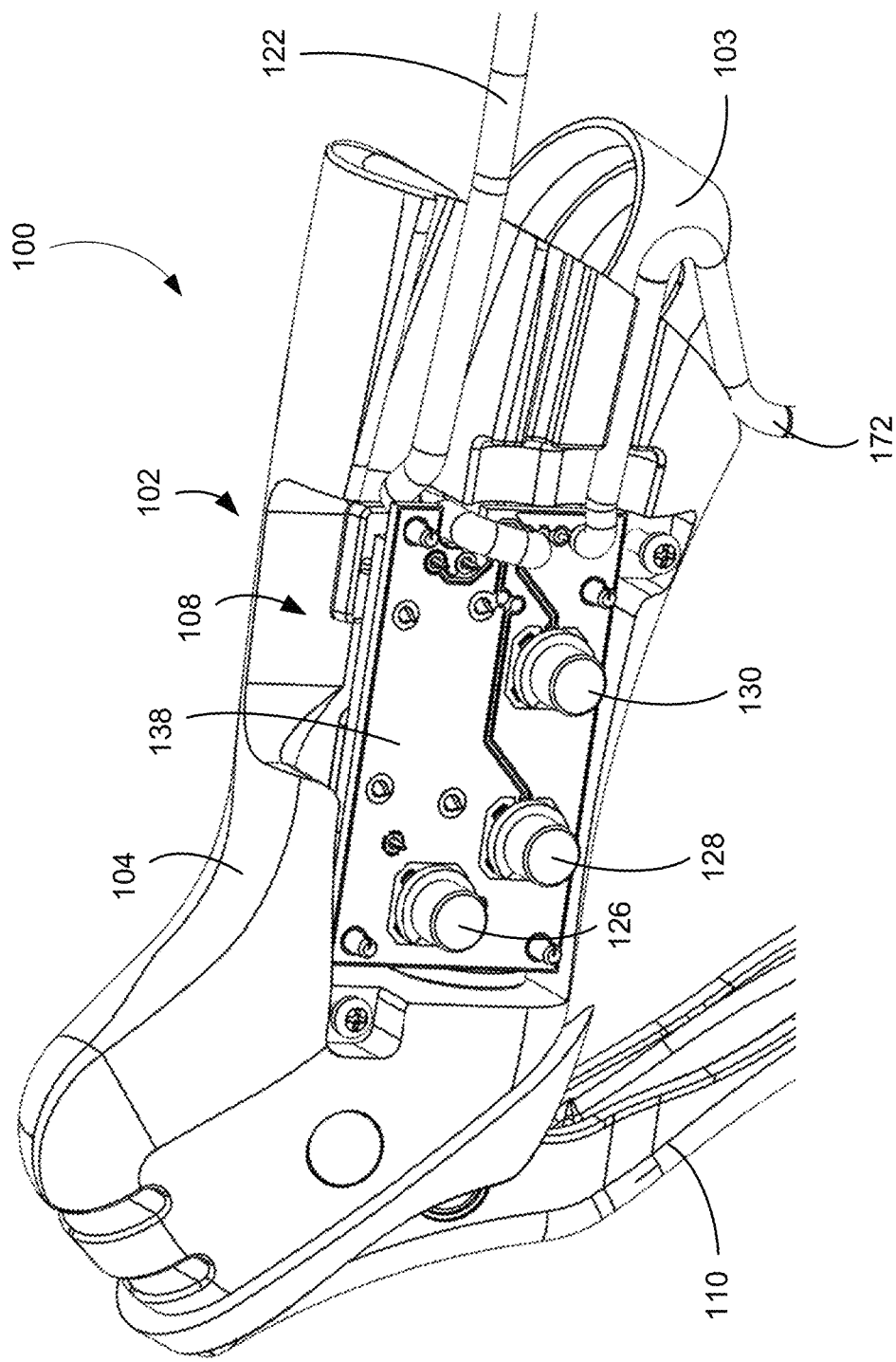
FIG. 4 is a detailed perspective view of the brake assembly of FIG. 1 with each of a hood cover and button plate removed.

A description of the internal components of the brake assembly 100 is now provided with reference to FIGS. 4-10. Referring first to FIG. 4, a detailed perspective view of the brake assembly 100 is provided with each of the hood cover 106 and the button plate 137 removed to better illustrate the underlying hood cavity 108 and the various components disposed therein. As shown in FIG. 4, a printed circuit board (PCB) 138 (or similar electronics assembly) may be disposed and mounted within the hood cavity 108 to mechanically support and electrically connect the various internal components of the brake assembly 100.

Figure 5:
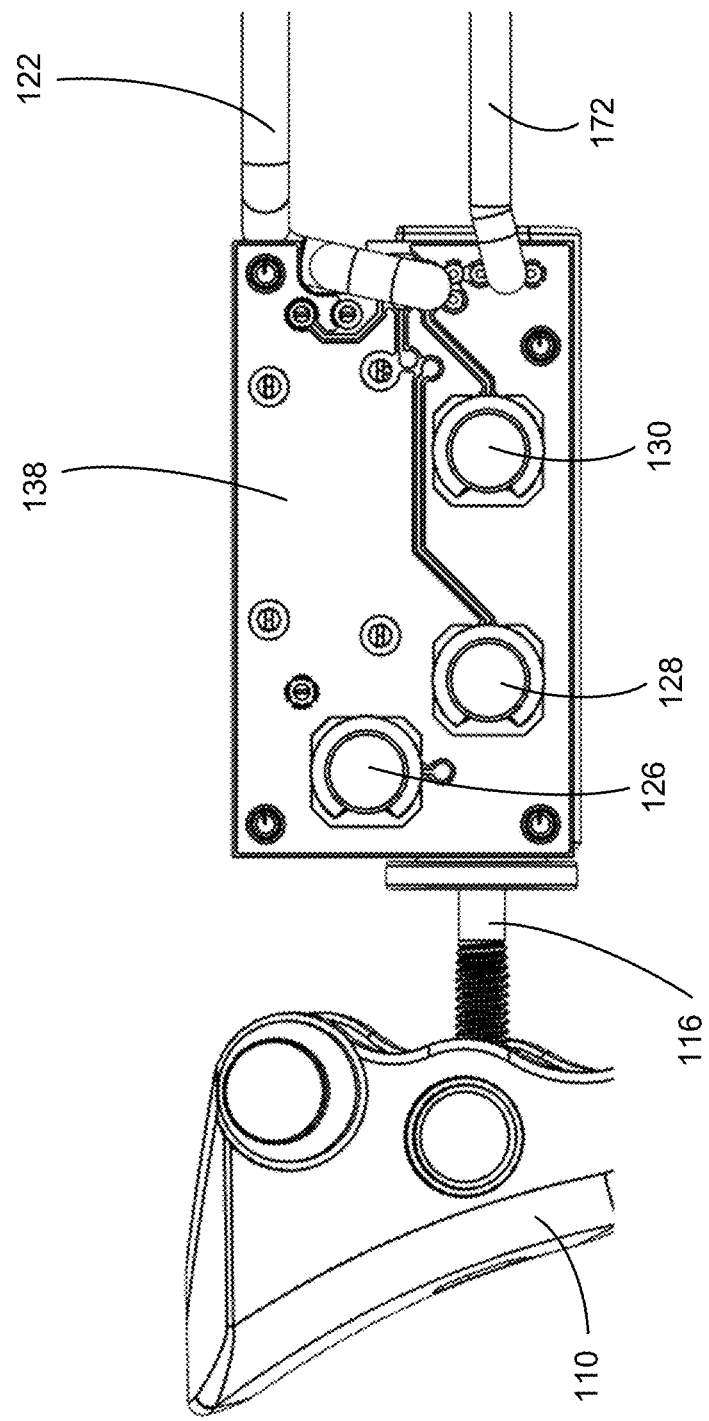
FIG. 5 is a detailed side view of the brake assembly of FIG. 1 with the hood body substantially removed to illustrate arrangement of an internal printed circuit board.
Figure 6:
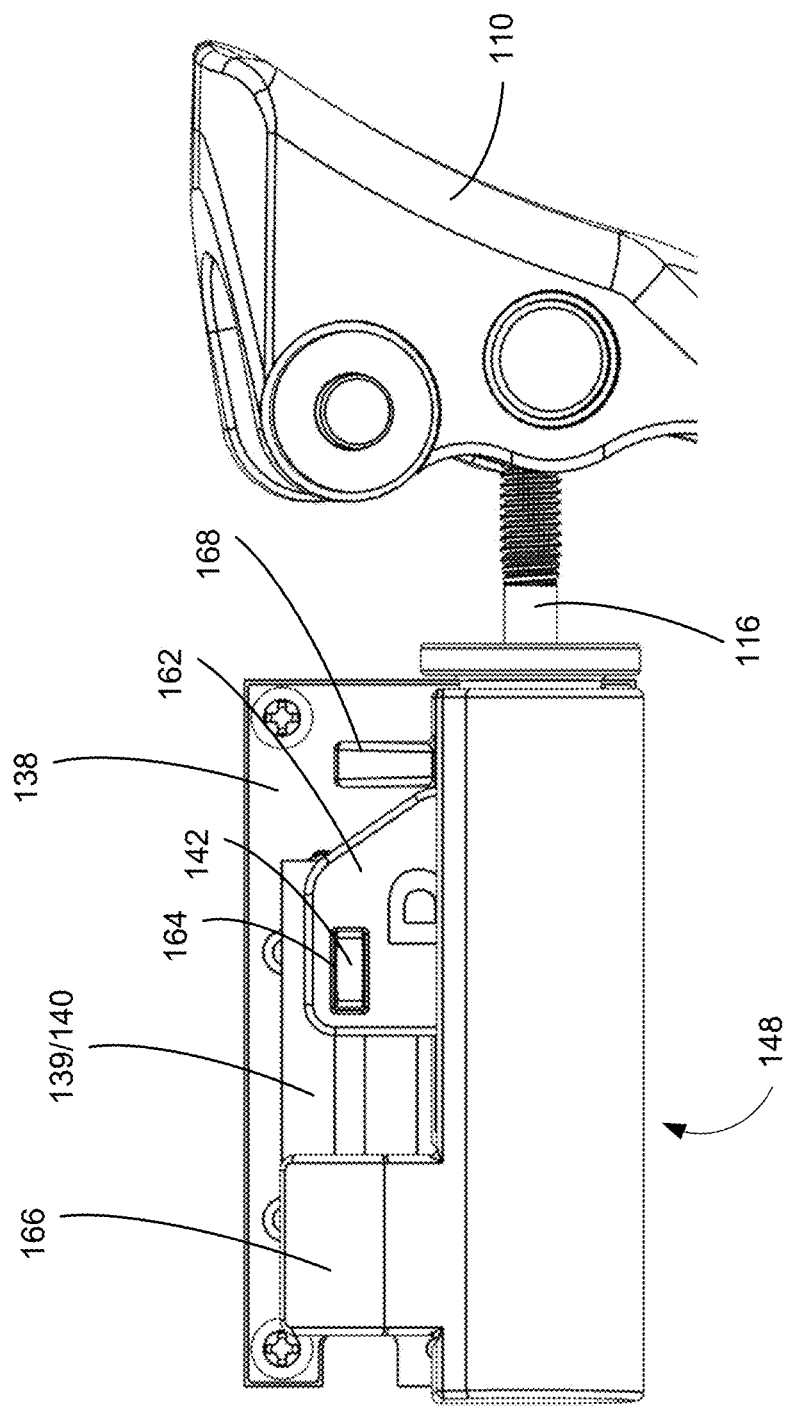
FIG. 6 is a detailed side view of the brake assembly of FIG. 1 with the hood body substantially removed to illustrate arrangement of a plunger assembly and a transducer.
Figure 7:
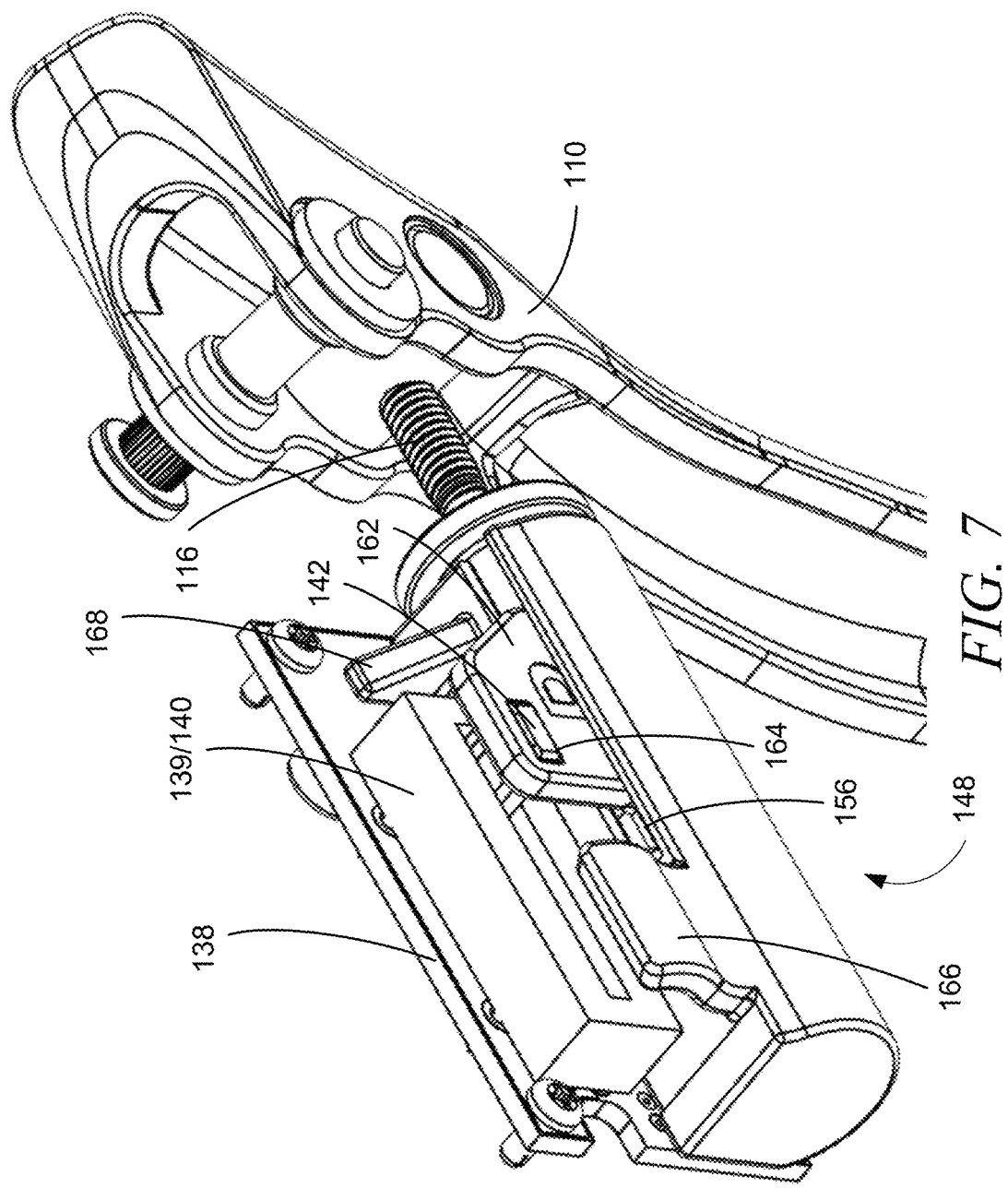
FIG. 7 is a detailed perspective view of the brake assembly of FIG. 1 with the hood body substantially removed to illustrate arrangement of the plunger assembly and the transducer.

FIGS. 5 and 6 are detailed side views and FIG. 7 is a detailed perspective view of the brake assembly 100 further excluding the hood body 106. As shown in FIG. 5, the PCB 138 may support each of the hood buttons 126-130 and may connect the hood buttons 126-130 and the remote control buttons 176, 180 (via remote control cable 172) to the connector cable 124. As shown in FIGS. 6 and 7, the PCB 138 may also support a transducer 139 adapted to convert movement and/or position of the brake lever 110 into a corresponding electrical signal. In the illustrated implementation, for example, the transducer 139 is a potentiometer 140 coupled to a plunger assembly 148 and configured to produce an analog voltage based on the position of a slide 142. For example, in one specific implementation, the output of the potentiometer may vary linearly from 0V to 3V across the full travel of the slide 142. The slide 142 of the potentiometer 140 is mated with a guide 162 of the plunger assembly 148 (e.g., by being inserted into an aperture 164 defined by the guide 162). As discussed below in further detail, the guide 162 is coupled to the brake lever 110 by a push pin 116 such that as a user presses/releases the brake lever 110, the guide 162 translates and moves the slide 142, thereby varying the output of the potentiometer 140. Accordingly, the output of the potentiometer 140 corresponds to the position of the brake lever 110 and may be used by a computing device communicatively coupled to the brake lever 110 (e.g., by connector 122 and connector cable 124) to determine an intended braking force. The intended braking force may then be applied to the stationary bike, trainer, etc. being ridden by the user, e.g., by changing a resistance level or actuating a braking mechanism.

Figure 8:
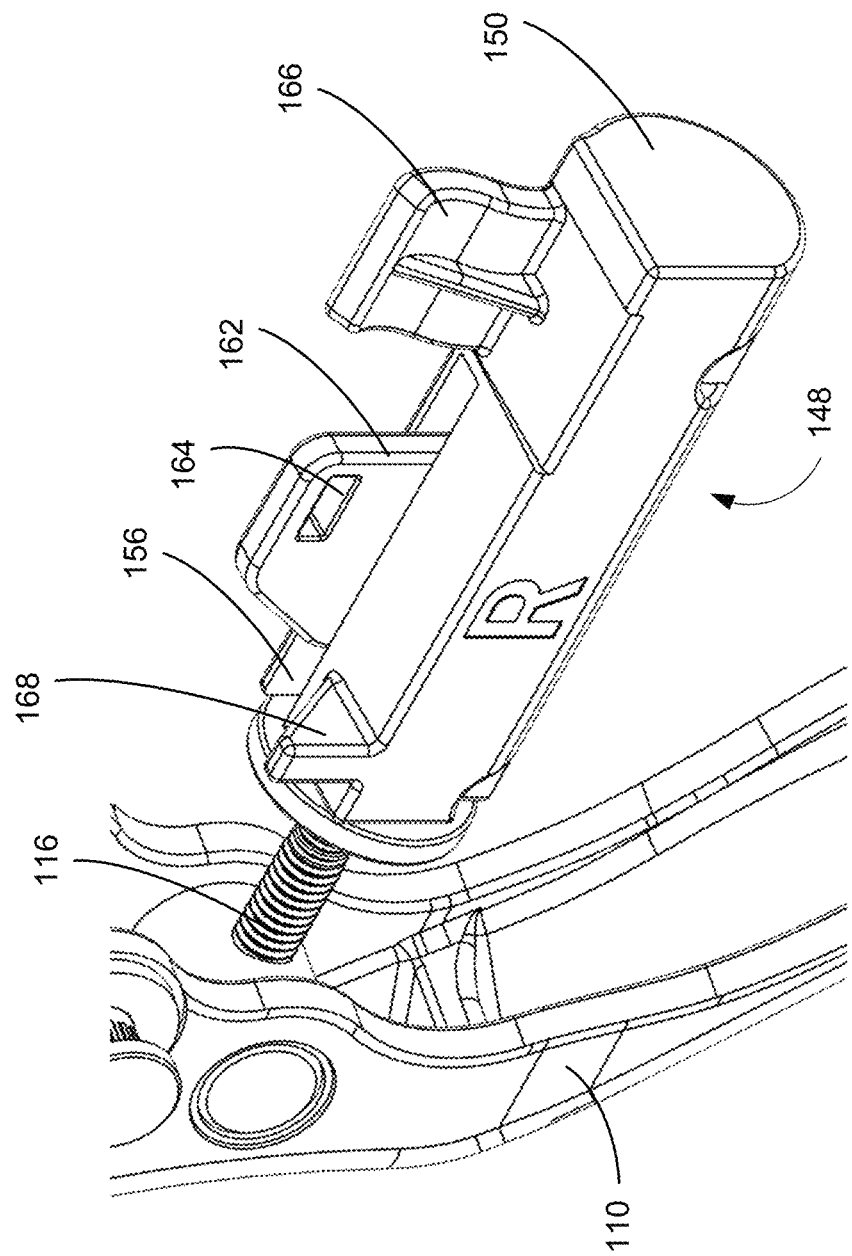
FIG. 8 is a detailed perspective view of the plunger assembly and the brake lever of the brake assembly of FIG. 1.
Figure 9:
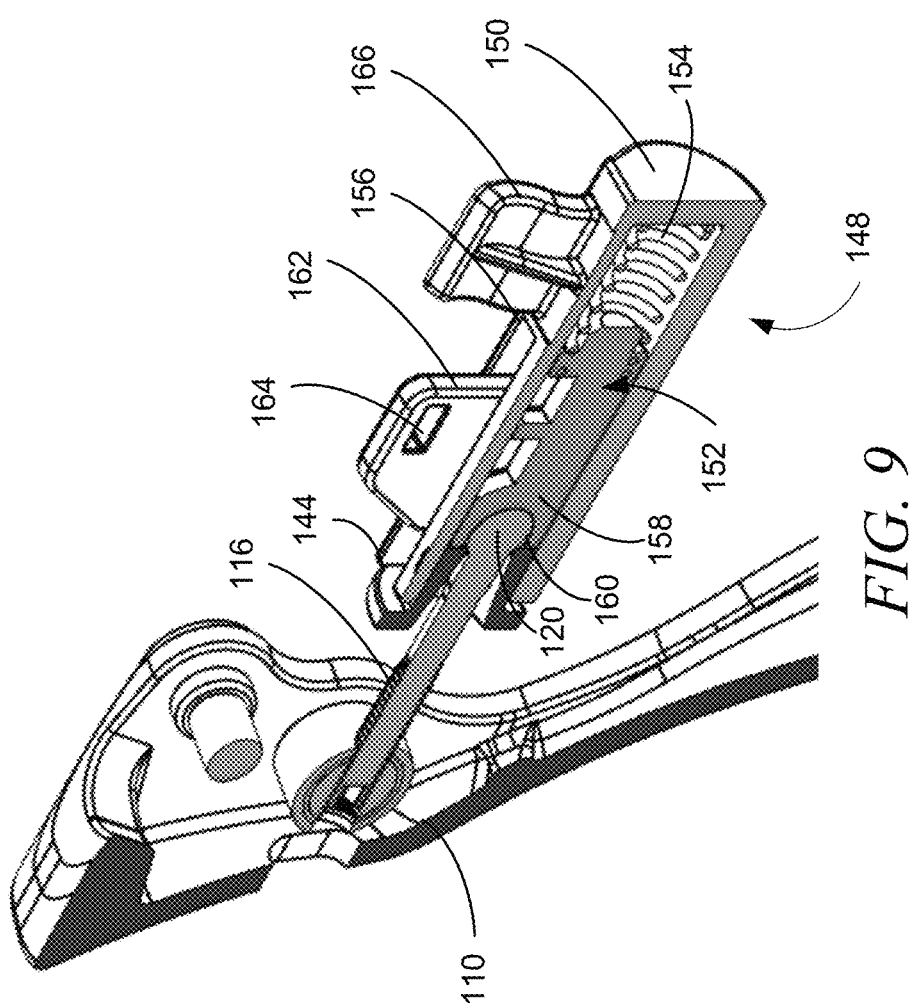
FIG. 9 is a cross-sectional perspective view of the plunger assembly and the brake lever of the brake assembly of FIG. 1.
Figure 10:
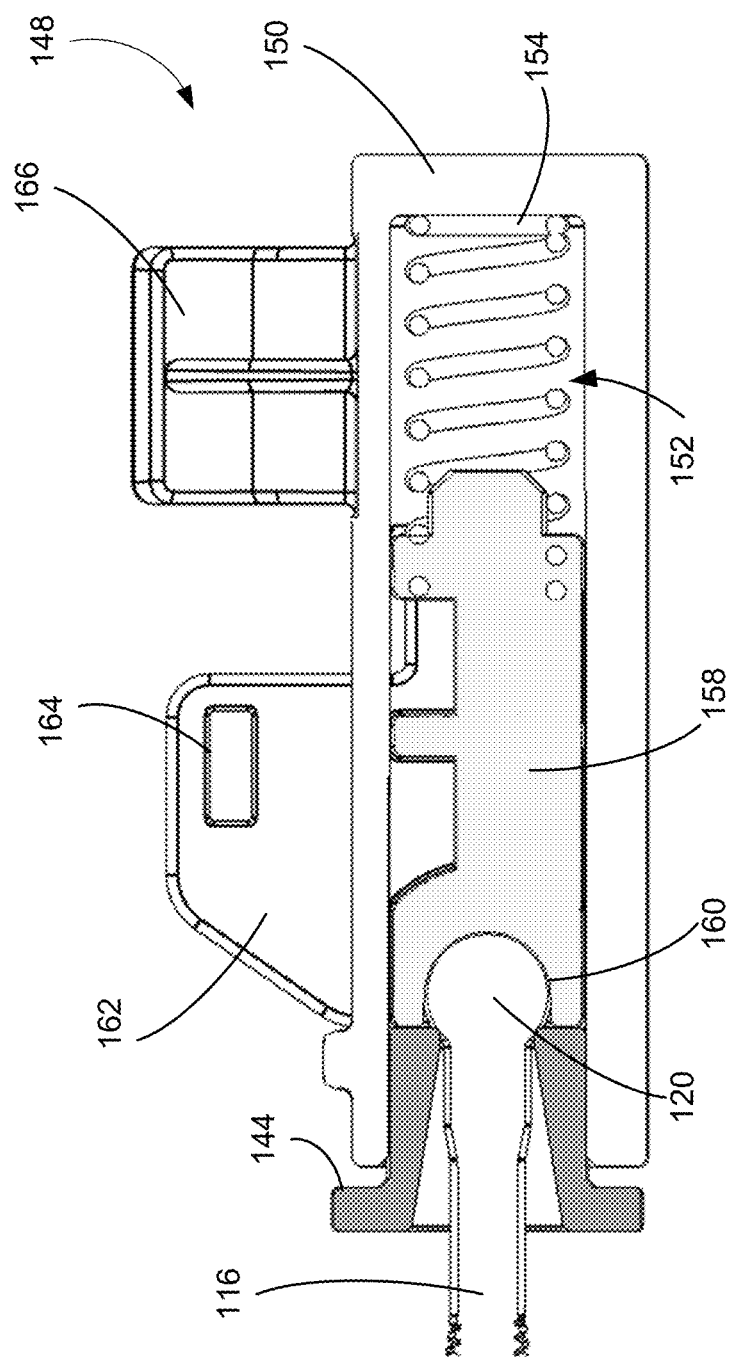
FIG. 10 is a cross-sectional side view of the plunger assembly of the brake assembly of FIG. 1.

Further details regarding the plunger assembly 148 are now provided with reference to FIGS. 8-10. In particular, FIG. 8 is a detailed perspective view of the plunger assembly 148, FIG. 9 is a perspective cross-sectional view of the plunger assembly 148, and FIG. 10 is a cross-sectional side view of the plunger assembly 148.

The plunger assembly 148 generally includes a housing 150 defining a housing cavity 152. The housing cavity 152 contains a plunger 158 that is coupled to the push pin 116 of the brake lever 110 and linearly translatable within the housing cavity 152 in response to the brake lever 110 being pressed/released. The housing cavity 152 also includes a spring 154 that biases the plunger 158 and, as a result, the brake lever 110 into a rest position (e.g., a position in which no brake force is to be applied).

The guide 162 for manipulating the transducer 139 (e.g., the potentiometer 140) may be coupled to or integrally formed with the plunger 158 such that movement of the plunger 158 also moves the guide 162. For example, in the illustrated implementation, the guide 162 is integrally formed with the plunger 158 and extends through a guide slot 156 (shown in FIGS. 7 and 8) defined in the housing 150.

Referring to FIGS. 9 and 10, in at least certain implementations, the plunger 158 may define a socket 160 within which a head 120 of the push pin 116 may be received and retained. In one example, the head 120 is positioned within the socket 160 and a retainer 144 is positioned behind the head 120 to maintain the head 120 within the socket 160. When fully assembled, the retained 144 may abut an interior surface of the hood body 106, thereby maintaining the head 120 within the socket 160.

The housing 150 may include exterior structural features that provide different functions. For example, as most clearly visible in FIG. 7, the housing 150 may include one or more retention features (such as retention feature 166) shaped and located to abut an inner surface of the hood body 106 to maintain the position of the plunger assembly 148 within the hood cavity 108. More specifically, such retention features may be shaped and located to prevent one or more of lateral movement, longitudinal movement, or rotation within the hood cavity. The housing 150 may also include reinforcement features, such as reinforcement feature 168, to provide additional support to other components. As shown in FIG. 7, for example, the reinforcement feature 168 may extend from the housing 150 to abut and support the PCB 138 to reduce potential fatigue of the PCB 138 that may result from actuation of the hood buttons 126-130.

It should be appreciated that the foregoing description is intended to provide only an example implementation of the present disclosure. More generally, the present disclosure is directed to a brake assembly for converting movement of a brake or similar lever into a corresponding signal indicative of the position of the lever. While described herein primarily in the context of stationary bicycles, bicycle trainers, and the like, implementations of the present disclosure are not limited to any specific application described herein. Moreover, even in the context of bicycle-related applications, implementations of the present disclosure are not limited to the specific examples discussed herein. For example and without limitation, the general concepts discussed herein in the context of a hood-style brake assembly may be readily adapted for use in a horizontal brake assembly.

Variations of other aspects of the present disclosure are also contemplated and, as a result, any specific components and functions described herein should be considered as non-limiting examples only. For example, while the transducer is predominantly discussed herein as a linear/slide potentiometer, one of skill in the art having the benefit of the present disclosure may readily substitute other transducers for the linear potentiometer. For example and without limitation, the linear potentiometer may be replaced by any of a rotary potentiometer, an optical encoder, a Hall effect sensor, an ultrasonic sensor, a string potentiometer, an optical proximity sensor, or any other suitable sensor suitable for measuring position and/or movement of the plunger (or similar component) disposed within the housing.

Similarly, while implementations described herein primarily rely on wired communication, any communication associated with brake assemblies in accordance with this disclosure may instead be conducted wirelessly. For example, the brake assembly may include a communications module having a wireless transmitter, e.g., a Bluetooth transmitter, for sending and receiving control signals and data to a remote computing device. In wired implementations, the buttons, transducer, etc., may include a lead to a point on the PCB from which a signal from the respective component is received. In other implementations, the buttons may include a lead to a harness aggregating other leads and signals with the harness being routed to whatever device is intended to receive and/or process the respective signals. In some instances, the PCB may include a processor to receive and process some signals directly, or to forward the signals to other components. In some cases, the processor on the PCB may digitize analog signals and provide the signal to other components.

As yet another example, the hood and/or remote control buttons are intended only as example controls that may be included in the brake assembly. More generally, brake assemblies in accordance with the present disclosure may include any suitable number or type of inputs, each of which may be configured to generate a corresponding signal for use in controlling a connected computing device or piece of equipment. For example, while the present disclosure primarily includes digital pushbuttons, other implementation may include, among other things, a directional pad, a thumb pad, a touch pad, a joystick, a thumbstick, a track ball, a microphone, a number of switches, or any other suitable input devices.

Several definitions that were applied throughout this disclosure will now be presented. The use of relational terms such as, but not limited to, "top," "bottom," "left," "right," "upper," "lower," "down," "up," and "side," are used in the description for clarity in specific reference to the figures and are not intended to limit the scope of the present disclosure or the appended claims.

While the present disclosure has been described with reference to various implementations, it will be understood that these implementations are illustrative and that the scope of the disclosure is not limited to them. Many variations, modifications, additions, and improvements are possible. More generally, implementations in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

Various embodiments of the disclosure are discussed in detail above. While specific implementations are discussed, it should be understood that this is done for illustration purposes only. A person skilled in the relevant art will recognize that other components and configurations may be used without parting from the spirit and scope of the disclosure. Thus, the preceding description and drawings are illustrative and are not to be construed as limiting. Numerous specific details are described to provide a thorough understanding of the disclosure. However, in certain instances, well-known or conventional details are not described in order to avoid obscuring the description.

References to one or an embodiment in the present disclosure can be references to the same embodiment or any embodiment; and, such references mean at least one of the embodiments. Reference to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others.

The terms used in this specification generally have their ordinary meanings in the art, within the context of the disclosure, and in the specific context where each term is used. Alternative language and synonyms may be used for any one or more of the terms discussed herein, and no special significance should be placed upon whether or not a term is elaborated or discussed herein. In some cases, synonyms for certain terms are provided. A recital of one or more synonyms does not exclude the use of other synonyms. The use of examples anywhere in this specification including examples of any terms discussed herein is illustrative only, and is not intended to further limit the scope and meaning of the disclosure or of any example term. Likewise, the disclosure is not limited to various embodiments given in this specification.

Without intent to limit the scope of the disclosure, examples of instruments, apparatus, methods and their related results according to the embodiments of the present disclosure are given. Note that titles or subtitles may be used in the examples for convenience of a reader, which in no way should limit the scope of the disclosure. Unless otherwise defined, technical and scientific terms used herein have the meaning as commonly understood by one of ordinary skill in the art to which this disclosure pertains. In the case of conflict, the present document, including definitions will control.

I claim:

1. A stationary exercise bicycle:
   a stationary bike frame supporting a handlebar and a rotatable element;
   a pair of pedals coupled to the frame, the pedals to drive the rotatable element;
   a brake assembly coupled to the handlebar, the brake assembly comprising:
   a hood body coupled to the handlebar and defining an internal hood cavity;
   a brake lever movably coupled to the hood body;
   a transducer disposed within the internal hood cavity, the transducer configured to generate a transducer output in response to movement of the brake lever, the transducer output corresponding to a current position of the brake lever; and
   an upshift button and a downshift button operably supported on the hood body; and
   a variable resistance device comprising an electromagnetic brake or an electric motor supported by the frame and configured to provide resistance to the rotatable element,
   wherein the resistance is provided based on the transducer output corresponding to the current position of the brake lever, and actuation of the upshift button and the downshift button, wherein actuation of the upshift button causes a stepwise increase in the resistance provided and actuation of the downshift button causes a stepwise decrease in the resistance provided.

2. The exercise device of claim 1, wherein the brake assembly further comprises a printed circuit board (PCB) disposed within the internal cavity, the PCB electrically coupled to the transducer.

3. The exercise device of claim 2, wherein the upshift button and the downshift button are electrically coupled to the PCB.

4. The exercise device of claim 3, further comprising a second set of input devices disposed outside the hood body and coupled to the PCB by a cable, the second set of input devices comprising a second upshift button and a second downshift button wherein actuation of the second upshift button causes a stepwise increase in the resistance provided by the variable resistance device and actuation of the second downshift button causes a stepwise decrease in the resistance provided by the variable resistance device.

5. The exercise device of claim 1, wherein the transducer is a linear potentiometer comprising a slide and transducer output further corresponds to a position of the slide.

6. A method of controlling resistance in the stationary exercise bicycle of claim 1, comprising:
   generating, by the transducer, an output corresponding to a current position of the brake lever;
   transmitting the output to a computing device of the stationary bicycle exercise device, wherein the computing device is configured to control the variable resistance device;
   in response to receiving the output, changing the resistance provided by the variable resistance device; and
   in response to receiving a signal at the computing device from the upshift button or the downshift button, stepwise increasing or stepwise decreasing, respectively, the resistance provided by the variable resistance device.

7. An exercise device comprising:
   a frame supporting a handlebar and a rotatable element;
   a pair of pedals coupled to the frame, the pedals to drive the rotatable element;
   a brake assembly coupled to the handlebar, the brake assembly comprising:
   a hood body coupled to the handlebar and defining an internal hood cavity;
   a brake lever movably coupled to the hood body; and
   a transducer disposed within the internal hood cavity and configured to generate a transducer output in response to movement of the brake lever, the transducer output corresponding to a current position of the brake lever, wherein the transducer is a linear potentiometer comprising a slide and the transducer output further corresponds to a position of the slide;
   a variable resistance device supported by the frame to control a resistance of the rotatable element to being driven, the control of the resistance being based on the transducer output; and
   wherein the brake assembly further comprises a plunger assembly disposed within the internal hood cavity, the plunger assembly comprising:
   a housing defining a housing cavity;
   a plunger disposed within the housing cavity and coupled to the brake lever such that the plunger is translatable within the housing cavity by movement of the brake lever;
   a guide extending from the plunger and coupled to the slide of the linear potentiometer such that translation of the plunger translates the slide; and
   a spring disposed within the housing cavity and biasing the plunger such that the brake lever is biased into a rest position.

* * * * *